(12) United States Patent
Gottlieb

(10) Patent No.: US 7,152,312 B2
(45) Date of Patent: Dec. 26, 2006

(54) METHOD FOR TRANSMITTING CURRENT THROUGH A SUBSTRATE

(75) Inventor: Gary Gottlieb, Irvine, CA (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 748 days.

(21) Appl. No.: 10/073,701

(22) Filed: Feb. 11, 2002

(65) Prior Publication Data

US 2003/0151905 A1 Aug. 14, 2003

(51) Int. Cl.
*H01R 43/00* (2006.01)
*H05K 3/36* (2006.01)

(52) U.S. Cl. ............................. 29/825; 29/830; 29/831; 29/846; 29/847; 29/852; 174/255; 174/262; 361/794

(58) Field of Classification Search .......... 29/825–834, 29/846–852; 174/260–264, 255; 257/686, 257/777; 361/794
See application file for complete search history.

(56) References Cited

U.S. PATENT DOCUMENTS

| | | | | |
|---|---|---|---|---|
| 5,347,258 A | * | 9/1994 | Howard et al. | 338/333 |
| 5,414,223 A | * | 5/1995 | Suski et al. | 174/262 |
| 6,137,064 A | * | 10/2000 | Kiani et al. | 174/266 |
| 6,189,201 B1 | * | 2/2001 | Trzaskowski et al. | 29/602.1 |
| 6,317,948 B1 | * | 11/2001 | Kola et al. | 29/25.42 |
| 6,335,566 B1 | | 1/2002 | Hirashima et al. | |
| 6,339,359 B1 | | 1/2002 | Kinoshita | |
| 6,388,208 B1 | * | 5/2002 | Kiani et al. | 174/266 |
| 6,711,814 B1 | * | 3/2004 | Barr et al. | 29/852 |

* cited by examiner

*Primary Examiner*—Minh Trinh
(74) *Attorney, Agent, or Firm*—Fogg and Associates; David N. Fogg

(57) ABSTRACT

A method for transmitting high-frequency current through a substrate is provided. The method comprises receiving the high-frequency current at a via passing through at least one conductive plane disposed within the substrate and coupled to the via with one or more tabs which span a gap between the at least one conductive plane and the via; and directing the high-frequency current along an uninterrupted path substantially on a surface of the via thereby bypassing the at least one conductive plane by conducting at least a portion of the high-frequency current between the one or more tabs.

3 Claims, 4 Drawing Sheets

METHOD FOR TRANSMITTING CURRENT THROUGH A SUBSTRATE

TECHNICAL FIELD

The present invention relates generally to the field of electronics and, in particular, to electrical connections in substrates.

BACKGROUND

Situations frequently arise when electronic components, such as capacitors, integrated circuits, diodes, inductors, or the like, disposed on opposite sides of a substrate, such as a circuit board, microchip, or the like, are electrically interconnected by a conductor, such as a via, disposed within the substrate. The via usually passes through one or more electrically conductive planes disposed within the substrate and makes direct contact with the electrically conductive planes so that the via and electrically conductive planes are electrically connected.

One example involves a method for reducing a noise voltage on an output impedance of a power source used to power an integrated circuit (IC). The noise voltage is usually the result of a high-frequency current caused by behavior of the IC that gets passed from the IC to the power source. The noise voltage normally gets superimposed on voltages supplied by the power source to the IC. This adversely affects the performance of the IC.

The method reduces this noise by reducing the output impedance by directing the high-frequency current to ground through a capacitor connected in close proximity to the IC rather than allowing the high-frequency current to pass to the power source. In one implementation of this method, the capacitor and IC are located on opposite sides of a circuit board, and power and ground connections of the IC are connected to the capacitor using vias that pass through the circuit board. The vias connected to the ground and power connections are normally respectively connected to conductive ground and power planes disposed within the circuit board between the IC and capacitor.

It is known to those skilled in the art that high-frequency current flows substantially on the surface of a conductor and does not penetrate substantially into the interior of the conductor. Therefore, when high-frequency current flows from an electronic component on one side of a substrate, such as the IC in the above example, to an electronic component on an opposite side of the substrate, such as the capacitor in the above example, the high-frequency current flows substantially on the surface of the via. However, when the high-frequency current encounters the location where the via is connected to a conductive plane, such as the power plane in the above example, the high-frequency current changes its course so that the high-frequency current flows substantially on a surface of the plane. This is because the direct contact between the via and the plane at this location forms a solid boundary between the via and the plane that the high-frequency current cannot flow through. Therefore, the high-frequency current is forced to change its course a number of times to flow around the conductive plane and back to the via. This occurs each time the high-frequency current encounters a location where the via is connected to a conductive plane and thus causes the high-frequency current to follow an elongated, meandering path as it flows between the electronic components. One problem with this is the elongated, meandering path presents an inductance between the electronic components, and a noise voltage gets produced on impedance of the inductance as the high-frequency current flows between the electronic components.

For the reasons stated above, and for other reasons stated below that will become apparent to those skilled in the art upon reading and understanding the present specification, there is a need in the art for reducing the impedance between electronic components disposed on opposite sides of a substrate that are electrically interconnected by a conductor passing through one or more electrically conductive planes disposed within the substrate.

SUMMARY

The above-mentioned problems with impedance between electronic components disposed on opposite sides of a substrate that are electrically interconnected by a conductor passing through one or more electrically conductive planes disposed within the substrate and other problems are addressed by embodiments of the present invention and will be understood by reading and studying the following specification.

In one embodiment, a substrate having a conductive plane and a via passing through the conductive plane is provided. The conductive plane contacts the via to electrically interconnect the via and the conductive plane. A gap in the conductive plane separates a surface of the via from the conductive plane to provide an uninterrupted path for electrical current flowing substantially on the surface of the via.

Further embodiments of the invention include methods and apparatus of varying scope.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide for a high-frequency current flowing substantially on a surface of a via to flow through a gap separating the via from a conductive plane through which the via passes. This reduces inductance and thus impedance and noise as compared to when a high-frequency current flowing substantially on a surface of a via changes its course and flows substantially on a surface of a conductive plane to flow around the plane.

Figure 1:
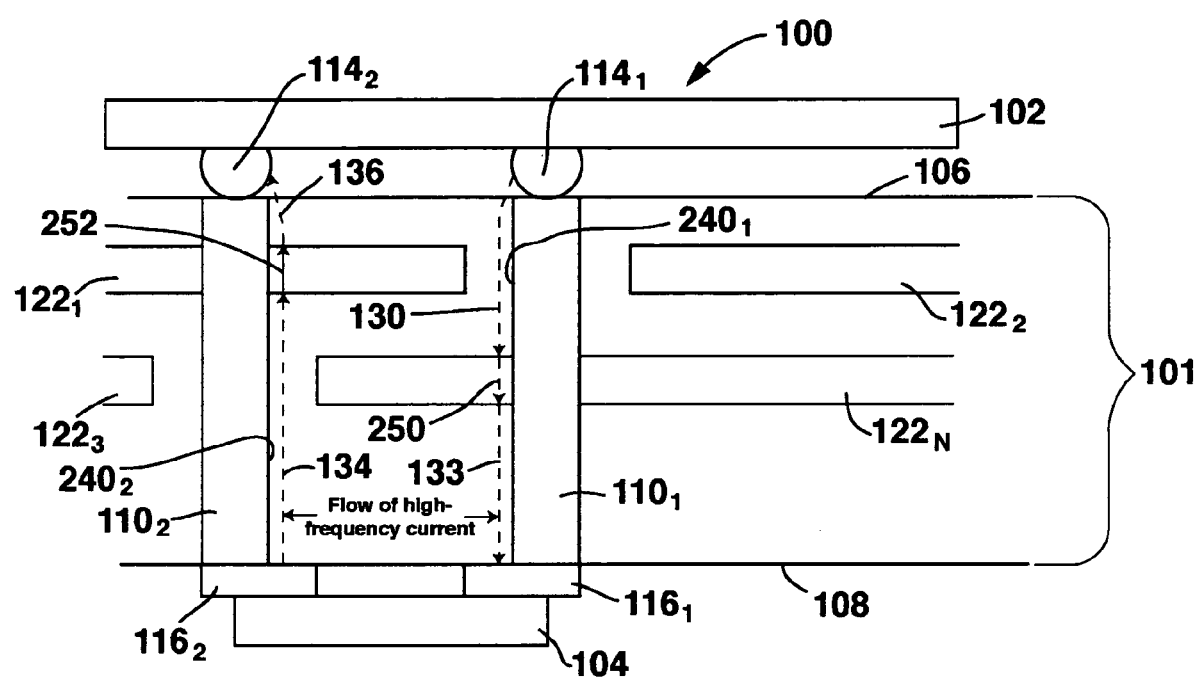
FIG. 1 illustrates an electronic device according to the teachings of the present invention.

FIG. 1 illustrates an electronic device 100 according to an embodiment of the present invention. Electronic device 100 includes a substrate 101, such as a circuit board, microchip, or the like. Electronic components 102 and 104, such as capacitors, integrated circuits, diodes, inductors, or the like, are respectively disposed on side 106 and opposite side 108 of substrate 101. Vias $110_1$ and $110_2$, e.g., an electrically conductive material, such as copper, aluminum, or the like, passing through substrate 101 interconnect electronic components 102 and 104. Specifically, via $110_1$ interconnects a contact point $114_1$ of electronic component 102, e.g., a solder ball, pad, pin, or the like, to a contact point $116_1$ of electronic component 104. Further, via $110_2$ interconnects a contact point $114_2$ of electronic component 102, e.g., a solder ball, pad, pin, or the like, to a contact point $116_2$ of electronic component 104. Conductive planes $122_1$ to $122_N$ are disposed within substrate 101. In one embodiment, conductive planes $122_1$ to $122_N$ are substantially parallel to each other. In another embodiment, via $110_1$ is connected to conductive plane $122_N$. In other embodiments, via $110_2$ is connected to conductive plane $122_1$. In some embodiments, conductive planes $122_1$ to $122_N$ are ground planes, power planes, interconnect planes, or the like and are of copper, aluminum, or the like.

Figure 2:
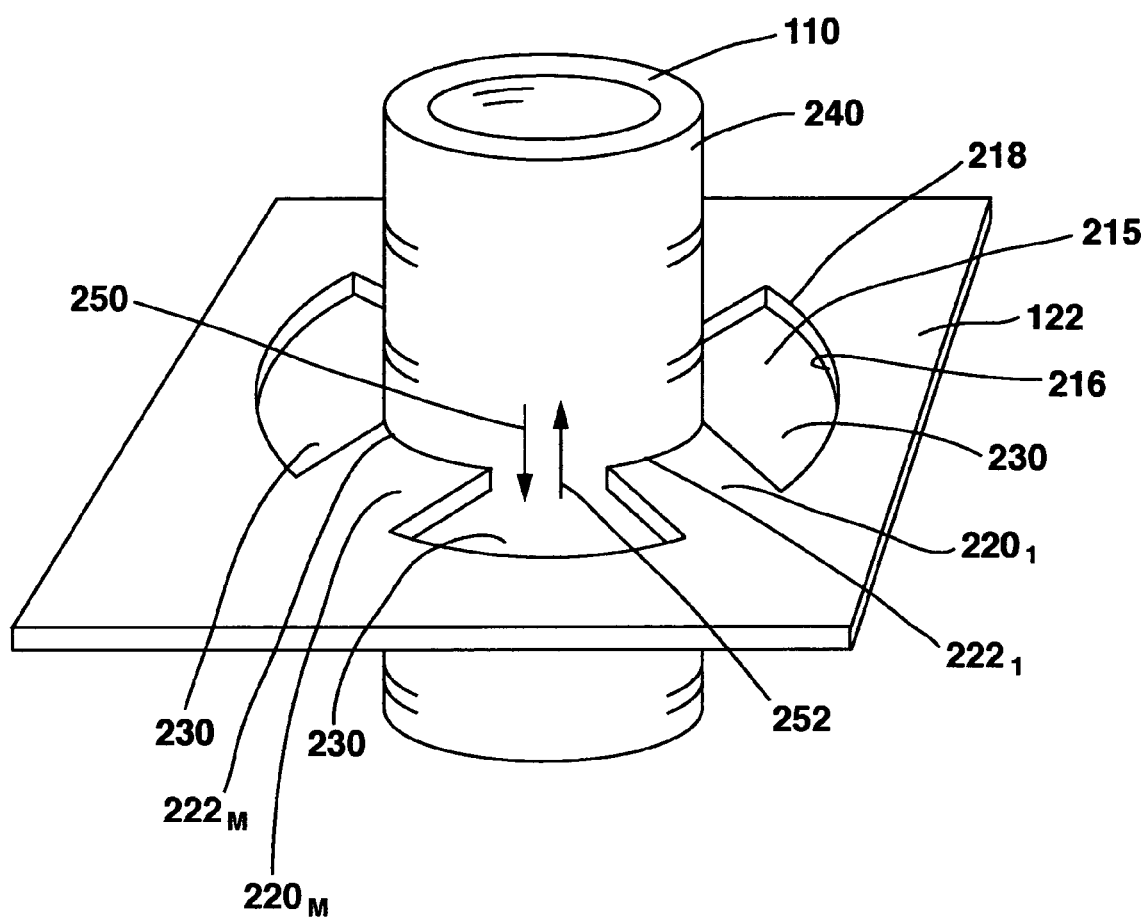
FIG. 2 is a perspective view illustrating a connection of a via to a plane according to an embodiment of the present invention.
Figure 3:
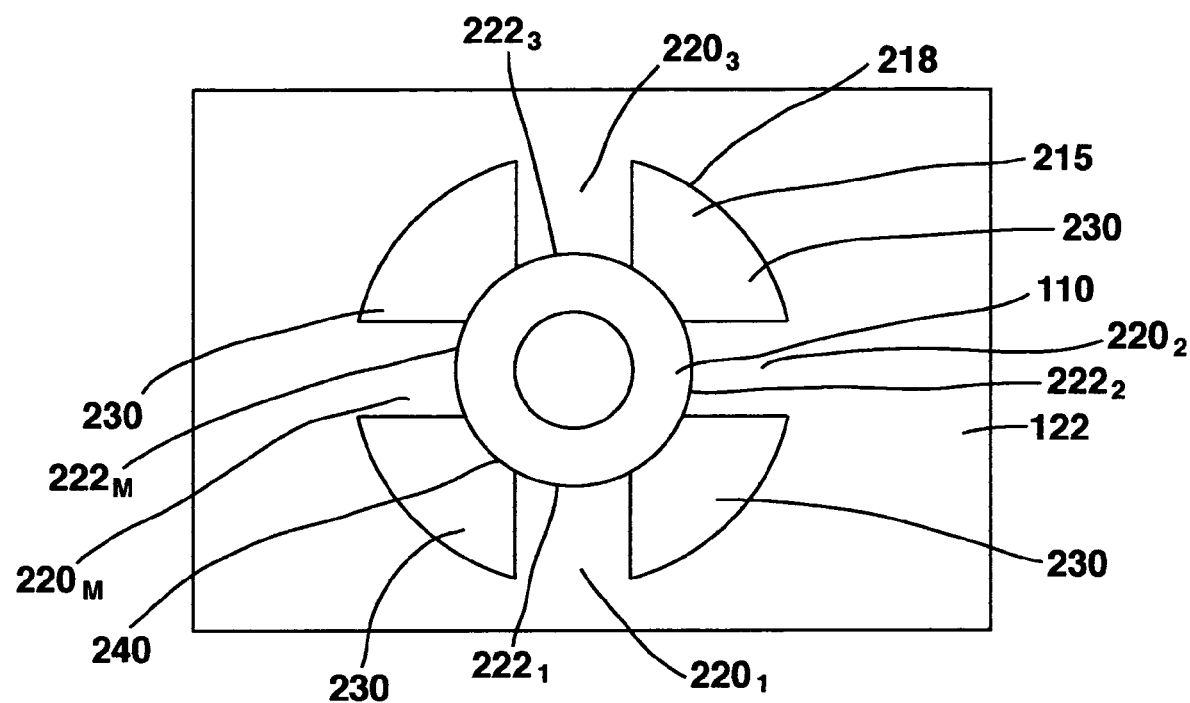
FIG. 3 is a top view of FIG. 2.

FIGS. 2 and 3 illustrate connection of vias 110 to conductive planes 122 according to an embodiment of the present invention. FIG. 2 is a perspective view and FIG. 3 is a top view of FIG. 2. In one embodiment, via 110 is an electrically conductive coating of a hole passing through a substrate and thus is a hollow cylinder, as shown in FIGS. 2 and 3.

Via 10 passes through an aperture 215 passing through conductive plane 122 to form a gap 230 between a surface 240 of via 10 and a surface 216 of conductive plane 122 corresponding to a perimeter 218 of aperture 215. In one embodiment, gap 230 is annular, as shown in FIGS. 2 and 3. Each of tabs $220_1$ to $220_M$ of conductive plane 122 radiate inwardly from perimeter 218 of aperture 215 and span gap 230. Each of tabs $220_1$ to $220_M$ of conductive plane 122 respectively contact via 110 at locations $222_1$ to $222_M$ to electrically connect conductive plane 122 to via 10. In one embodiment, each of tabs $220_1$ to $220_M$ is integral with conductive plane 122. In another embodiment, each of tabs $220_1$ to $220_M$ lies substantially in a plane of conductive plane 122. Gap 230 provides an uninterrupted path for a portion of a high-frequency current flowing substantially on surface 240 of via 110 to flow between each of tabs $220_1$ to $220_M$, through gap 230, and past conductive plane 122, as depicted by arrows 250 and 252. Therefore, this portion of the high-frequency current does not change its course as occurs in conventional situations where there is no gap between the via and the conductive plane.

In operation, as depicted in FIG. 1, high-frequency current flows from connection $114_1$ substantially on surface $240_1$ of via $110_1$ to the location where via $110_1$ is connected to conductive plane $122_N$, as depicted by arrow 130. As discussed above, gap 230 provides an uninterrupted path for a portion of the high-frequency current to flow as shown by arrow 250 in FIG. 1. This portion of the high-frequency current does not alter its course upon encountering the location where via $110_1$ is connected to conductive plane $122_N$ to flow on the surface of conductive plane $122_N$ as would occur in conventional situations where there is no gap between the via and the conductive plane. Therefore, the inductance and thus the impedance for the high-frequency current is lower and it results in lower noise voltage than for conventional situations where the high-frequency current changes its course to flow around the conductive plane.

The high-frequency current continues to flow substantially on surface $240_1$ of via $110_1$ to connection $116_1$ of electronic component 106, as shown by arrow 133. The high-frequency current flows through electronic component 106 from connection $116_1$ to connection $116_2$. Then, the high-frequency current flows substantially on surface $240_2$ of via $110_2$ from connection $116_2$ to the location where via $110_2$ is connected to conductive plane $122_1$, as shown by arrow 134. As discussed above, gap 230 provides an uninterrupted path for a portion of the high-frequency current to flow as shown by arrow 252 in FIG. 1. This portion of the high-frequency current does not alter its course upon encountering the location where via $110_2$ is connected to conductive plane $122_1$ to flow on the surface of conductive plane $122_1$ as would occur in conventional situations where there is no gap between the via and the conductive plane. Therefore, the inductance and thus the impedance for the high-frequency current is lower and it results in lower noise voltage than for conventional situations where the high-frequency current changes its course to flow around the conductive plane. The high-frequency current then continues to flow substantially on surface $240_2$ of via $110_2$ to connection $114_2$, as indicated by arrow 136.

Figure 4:
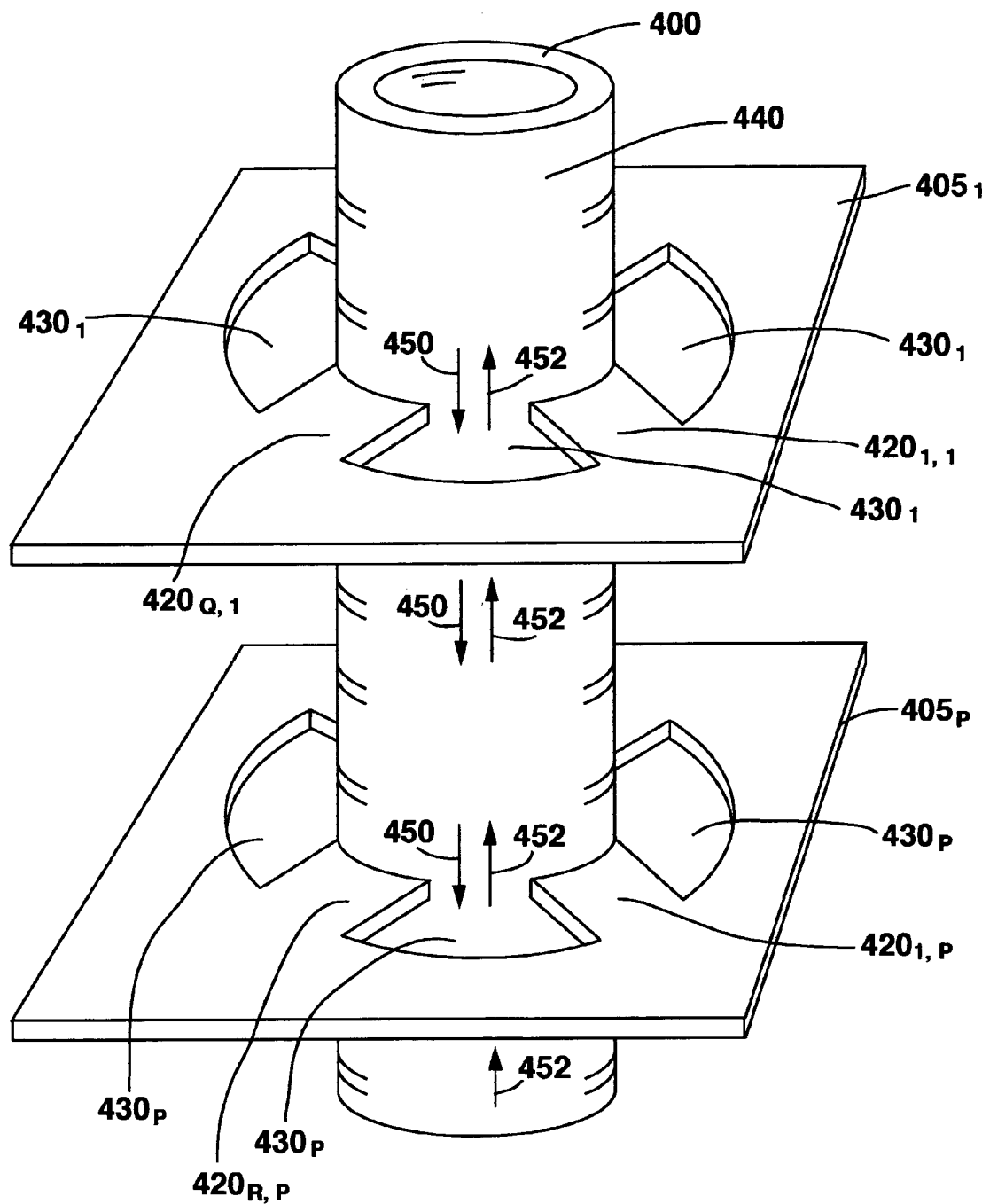
FIG. 4 is a perspective view illustrating a connection of a via to more than one plane according to another embodiment of the present invention.

FIG. 4 illustrates a via 400 passing through each of conductive planes $405_1$ to $405_P$ according to another embodiment of the present invention. In one embodiment, via 400 and each of conductive planes $405_1$ to $405_P$ are disposed in a substrate, such as substrate 101 of FIG. 1. In various embodiments, each of conductive planes $405_1$ to $405_P$ is a ground plane, power plane, interconnect plane, or the like and is of copper, aluminum, or the like. In one embodiment, via 400 interconnects electronic components, such as electronic components 102 and 104 of FIG. 1, respectively disposed on opposite sides of a substrate. In another embodiment, via 400 is as described for via 10 of FIGS. 2 and 3.

In other embodiments, via 400 is connected to each of conductive planes $405_1$ to $405_P$ as described above for via 110 and conductive plane 122 of FIGS. 2 and 3 so that gaps $430_1$ to $430_P$ respectively separate a surface 440 of via 400 from conductive planes $405_1$ to $405_P$ and each of tabs $420_{1,1}$ through $420_{Q,1}$ to tabs $420_{1,P}$ through $420_{R,P}$, respectively of each of conductive planes $405_1$ to $405_P$, respectively span each of gaps $430_1$ to $430_P$ to electrically connect each of conductive planes $405_1$ to $405_P$ to via 400.

At least a portion of each of gaps $430_1$ to $430_P$ is aligned with a portion of another of each of gaps $430_1$ to $430_P$. For example, in one embodiment, a portion of gap $430_1$ that lies between successively adjacent tabs of tabs $420_{1,1}$ through $420_{Q,1}$ of conductive plane $405_1$ aligns with a portion of gap $430_P$ that lies between successively adjacent tabs of tabs $420_{1,P}$ through $420_{R,P}$ of conductive plane $405_P$. This provides an uninterrupted path for a portion of a high-frequency current flowing substantially on surface 440 of via 400 to flow between each of tabs $420_{1,1}$ through $420_{Q,1}$, through gap $430_1$, between each of tabs $420_{1,P}$ through $420_{R,P}$, and through gap $430_P$ or vice versa, as shown by arrows 450 and 452 in FIG. 4.

To manufacture an electronic circuit board according to an embodiment of the present invention, conductive planes 122 are formed within substrate 101. Vias 110 are also formed in substrate 101 so that they respectively pass through and makecontact with conductive planes 122, as illustrated in FIGS. 1–3. In one embodiment, via 400 is formed in a substrate, such as substrate 101, and passes through and makes contact with each of conductive planes $405_1$ to $405_P$, as illustrated in FIG. 4.

A gap 230 is formed between surface 240 of via 110 and conductive plane 122 to provide an uninterrupted path for current flowing substantially on surface 240. In one embodiment, forming gap 230 includes forming tabs 220$_1$ to 220$_M$ that span gap 230 and contact surface 240, as shown in FIGS. 2 and 3. In another embodiment, each of gaps 430$_1$ to 430$_P$ is respectively formed between each of conductive planes 405$_1$ to 405$_P$ and surface 440 of via 400, and a portion of each of gaps 430$_1$ to 430$_P$ is aligned with a portion of another of each of gaps 430$_1$ to 430$_P$, as shown in FIG. 4. In some embodiments, forming each of gaps 430$_1$ to 430$_P$ includes respectively forming each of tabs 420$_{1,1}$ through 420$_{Q,1}$ to tabs 420$_{1,P}$ through 420$_{R,P}$, as shown in FIG. 4.

CONCLUSION

Embodiments of the present invention have been described. The embodiments provide for a high-frequency current flowing substantially on a surface of a via to flow through a gap separating the via from a conductive plane through which the via passes. This reduces inductance and thus impedance and noise as compared to when a high-frequency current flowing substantially on a surface of a via changes its course and flows substantially on a surface of a conductive plane to flow around the plane.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, via 110 of FIGS. 2 and 3 and via 400 of FIG. 4 can be a solid rather than hollow. Embodiments of the present invention are not limited by substrates, such as 101, having two vias, such as 110$_1$ and 110$_2$, as shown in FIG. 1. Rather any number of vias 110 may be disposed within substrate 101, and these vias may be electrically connected to any number of conductive planes, e.g., conductive planes 122$_1$ to 122$_N$ disposed within the substrate. Moreover, these vias may interconnect any number of electronic components disposed on opposite sides of the substrate. It is manifestly intended that this invention be limited only by the following claims and equivalents thereof.

What is claimed is:

1. A method for transmitting high-frequency current through a substrate, the method comprising:
   receiving the high-frequency current at a via passing through at least one conductive plane disposed within the substrate and coupled to the via with one or more tabs which span a gap between the at least one conductive plane and the via; and
   directing the high-frequency current along an uninterrupted path substantially on a surface of the via thereby bypassing the at least one conductive plane by conducting at least a portion of the high-frequency current between the one or more tabs.

2. The method of claim 1, wherein receiving the current at the via comprises receiving the current from an electronic component disposed on the substrate.

3. The method of claim 1, wherein receiving the high-frequency current at a via passing through at least one conductive plane disposed within a substrate comprises receiving the high-frequency current at a via passing through two or more conductive planes disposed within the substrate, each of the two or more conductive planes coupled to the via with one or more tabs which span a gap between each of the two or more conductive planes and the via, wherein at least a portion of one of the one or more tabs coupling one of the two or more conductive planes to the via is aligned with at least a portion of one of the one or more tabs coupling another of the two or more conductive planes to the via.

* * * * *